US011304140B2

(12) United States Patent
Ge et al.

(10) Patent No.: US 11,304,140 B2
(45) Date of Patent: *Apr. 12, 2022

(54) MEMRISTOR CODE COMPARATOR TO COMPARE WAKE UP SIGNALS TO REFERENCE SIGNALS

(71) Applicant: HEWLETT-PACKARD DEVELOPMENT COMPANY, L.P., Houston, TX (US)

(72) Inventors: Ning Ge, Palo Alto, CA (US); Tyler Sims, Corvallis, OR (US); Helen A. Holder, Palo Alto, CA (US); Robert Ionescu, Palo Alto, CA (US); Rongliang Zhou, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 851 days.

This patent is subject to a terminal disclaimer.

(21) Appl. No.: 16/075,694

(22) PCT Filed: Jan. 31, 2017

(86) PCT No.: PCT/US2017/015837
§ 371 (c)(1),
(2) Date: Aug. 6, 2018

(87) PCT Pub. No.: WO2018/143943
PCT Pub. Date: Aug. 9, 2018

(65) Prior Publication Data
US 2021/0211983 A1     Jul. 8, 2021

(51) Int. Cl.
*H04W 52/02*     (2009.01)
*G11C 13/00*     (2006.01)
*H04L 5/00*     (2006.01)

(52) U.S. Cl.
CPC ....... *H04W 52/0235* (2013.01); *G11C 13/004* (2013.01); *G11C 13/0069* (2013.01);
(Continued)

(58) Field of Classification Search
None
See application file for complete search history.

(56) References Cited

U.S. PATENT DOCUMENTS 4,965,550 A    10/1990   Wroblewski
5,790,946 A    8/1998   Rotzoll
(Continued)

FOREIGN PATENT DOCUMENTS

CN          105188114 A     12/2015
WO       2012010676 A1     1/2012
(Continued)

OTHER PUBLICATIONS

Bdiri et al., "An Ultra-Low Power Wake-Up Receiver for Real-time constrained Wireless Sensor Networks", Cited from : AMA Conferences 2015—Sensor 2015 and IRS2 2015, 2015, 6 Pages.
(Continued)

*Primary Examiner* — Saad Khawar
(74) *Attorney, Agent, or Firm* — Dicke Billig & Czaja PLLC (57) ABSTRACT

One example of a device includes an antenna, a memristor code comparator, and a controller. The antenna is to receive a wake up signal. The memristor code comparator is to compare the wake up signal to a reference signal. The controller is to provide a trigger signal to wake up the device in response to the wake up signal matching the reference signal.

20 Claims, 6 Drawing Sheets

(52) U.S. Cl.
CPC ........ *G11C 13/0097* (2013.01); *H04L 5/0048* (2013.01); *G11C 2213/77* (2013.01)

(56) References Cited

U.S. PATENT DOCUMENTS

| | | | |
|---|---|---|---|
| 8,285,243 | B2 | 10/2012 | Kang et al. |
| 9,413,403 | B2 | 8/2016 | Wentzloff et al. |
| 10,786,171 | B2* | 9/2020 | Ge .................. A61B 5/7221 |
| 2007/0285212 | A1* | 12/2007 | Rotzoll ............ H04W 52/0293 340/10.1 |
| 2015/0087255 | A1* | 3/2015 | Wentzloff ......... H04W 52/0235 455/296 |
| 2015/0347896 | A1* | 12/2015 | Roy ....................... G06N 3/063 365/148 |
| 2018/0078181 | A1* | 3/2018 | Cronin ................. A61B 5/1118 |

FOREIGN PATENT DOCUMENTS

| | | |
|---|---|---|
| WO | 2012047413 A1 | 4/2012 |
| WO | 2016153513 A1 | 9/2016 |

OTHER PUBLICATIONS

Demirkol et al., "Wake-up receivers for wireless sensor networks: Benefits and challenges—[Accepted from open call]", Retrieve form internet—https://www.researchgate.net/publication/224601438_Wake-up_receivers_for_wireless_sensor_networks_Benefits_and_challenges_-_Accepted_from_open_call, 2009, 32 Pages.

Oller et al., "Design, Development and Performance Evaluation of a Low-cost, Low-power Wake-up Radio System For WSN", Retrieve from internet—https://upcommons.upc.edu/handle/2117/22590, Nov. 1, 2013, 1 Page.

\* cited by examiner

MEMRISTOR CODE COMPARATOR TO COMPARE WAKE UP SIGNALS TO REFERENCE SIGNALS

BACKGROUND

A wireless sensor network (WSN) is a set of autonomous sensor nodes deployed in a specific location to gather information, such as physical or environmental conditions. The sensor nodes act cooperatively to pass their data through the network to a user device. Each sensor node includes an antenna, a radio transceiver, a controller, a sensor interface, and an energy source. The energy source may include a battery.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

The transceiver of a wireless sensor network (WSN) device consumes a significant portion of the total power of the device. Therefore, the transceiver and potentially other circuits of a WSN device may be set to a low power sleep mode or may be shut down entirely when the WSN device is not active. To wake up the WSN device including the transceiver, the WSN device may include a wake up receiver (WURx), which wakes up the WSN device in response to receiving a wake up signal to the dedicated device. The WURx is an additional low power circuit that continuously listens to the wireless channel for a wake up signal matching a reference signal (e.g., with unique address information) of the WSN device. Once a wake up signal for the WSN device is detected, the other circuits including the transceiver of the WSN device are activated. Since the WURx is continuously active, the overall power consumption of the WSN device may be minimized by minimizing the power consumption of the WURx.

Accordingly, a WSN device as disclosed herein includes a WURx including a memristor code comparator to compare a wake up signal to a reference signal. In response to the wake up signal matching the reference signal, a trigger signal is provided to wake up the WSN device. The memristor code comparator includes a memristor array including a plurality of row lines, a plurality of column lines, and a plurality of memristors, wherein each of the memristors is coupled between a unique combination of a row line and a column line. Each bit of the wake up signal may be applied to a corresponding row line while each corresponding bit of the reference signal may be applied to a corresponding column line. In response to any bit of the wake up signal varying from a corresponding bit of the reference signal by a threshold value, the corresponding memristor of the memristor code comparator will change states indicating the wake up signal does not match the reference signal. In response to each bit of the wake up signal matching the corresponding bit of the reference signal, none of the memristors will change states indicating the wake up signal matches the reference signal. By using a WURx including a memristor code comparator to compare the wake up signal to the reference signal, the overall wake up circuit is simplified and uses less power than a WURx that does not use a memristor code comparator. In one example, the wake up and reference signals are analog signals and the comparison may be performed directly without using analog to digital conversion.

Figure 1:
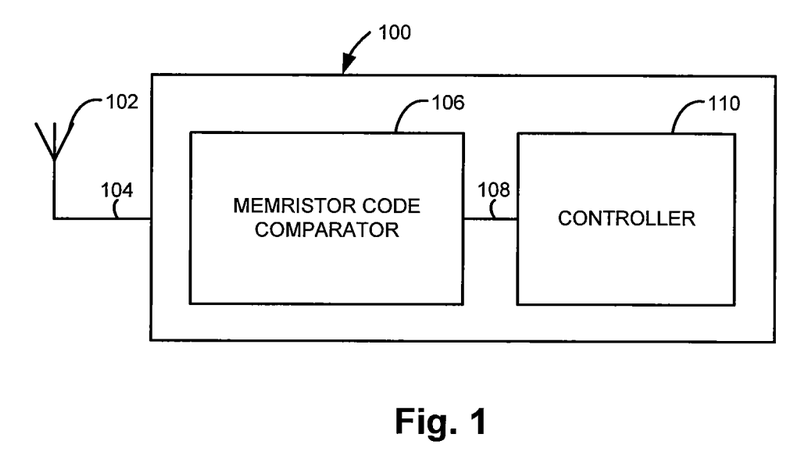
FIG. 1 is a block diagram illustrating one example of a wireless sensor network (WSN) device including a memristor code comparator to compare a wake up signal to a reference signal.

FIG. 1 is a block diagram illustrating one example of a WSN device 100. WSN device 100 includes an antenna 102, a memristor code comparator 106, and a controller 110. Antenna 102 is communicatively coupled to WSN device 100 through a communication path 104. Memristor code comparator 106 is communicatively coupled to controller 110 through a communication path 108.

When not active (e.g., when not transmitting and/or receiving instructions and/or data), WSN device 100 may be set to a low power sleep mode or portions of WSN device 100 may be shut down entirely to conserve power. When WSN device 100 is to be accessed by a user device, antenna 102 receives a wake up signal from the user device. In one example, the wake up signal contains an address that uniquely identifies WSN device 100. Memristor code comparator 106 compares the wake up signal to a reference signal. The reference signal is stored within WSN device 100 and may be provided to memristor code comparator 106 by controller 110.

In one example, as will be described in more detail below with reference to FIG. 2A, memristor code comparator 106 include a memristor array including a plurality of row lines, a plurality of column lines, and a plurality of memristors, wherein each of the memristors is coupled between a unique combination of a row line and a column line. In another example, as will be described in more detail below with reference to FIG. 2B, memristor code comparator 106 includes a memristor array including a plurality of first nodes, a plurality of second nodes, and a plurality of memristors, wherein each of the memristors is coupled between a unique combination of a first node and a second node. The wake up signal is applied to the row lines or column lines and the reference signal is applied to the other of the row lines and column lines. In response to memristor code comparator 106 indicating that the wake up signal matches the reference signal, controller 110 provides a trigger signal to wake up WSN device 100. In response to memristor code comparator 106 indicating that the wake up signal does not match the reference signal (e.g., the wake up signal is for a different WSN device), controller 110 resets memristor code comparator 106 so that memristor code comparator 106 is ready for another comparison when another wake up signal is received.

Figure 2A:
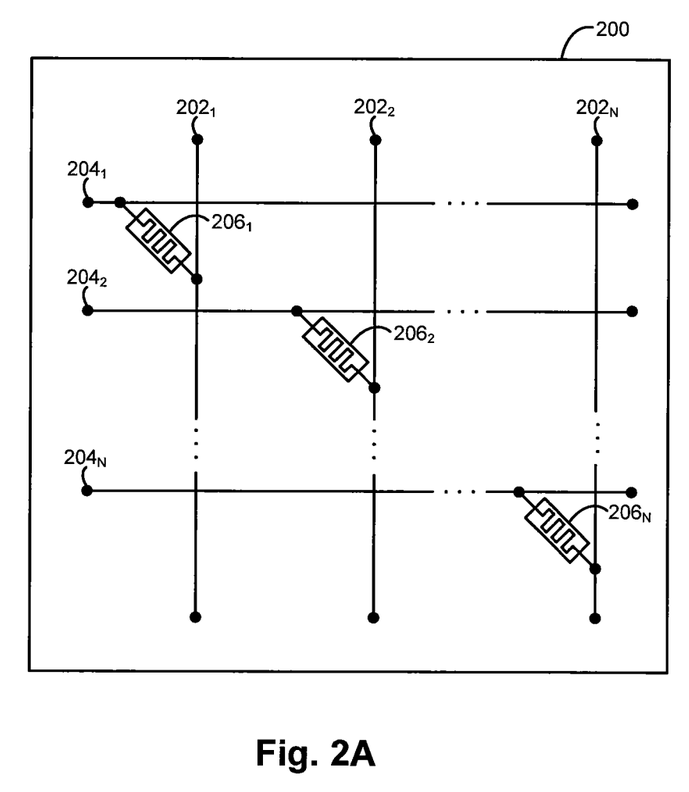
FIG. 2A illustrates one example of a memristor code comparator.

FIG. 2A illustrates one example of a memristor code comparator 200. In one example, memristor code comparator 200 provides memristor code comparator 106 previously described and illustrated with reference to FIG. 1. Memristor code comparator 200 includes a plurality of column lines $202_1$ through $202_N$, a plurality of row lines $204_1$ through $204_N$, and a plurality of memristors $206_1$ through $206_N$, where "N" is any suitable number based on the number of bits (for digital signals) or the number of analog values (for analog signals) to be compared. A first terminal of each memristor $206_1$ through $206_N$ is electrically coupled to a column line $202_1$ through $202_N$ and a second terminal of each memristor $206_1$ through $206_N$ is electrically coupled to a row line $204_1$ through $204_N$, respectively.

Memristors $206_1$ through $206_N$ are two-terminal passive devices that can be electrically switched between two states including a high-resistance state (HRS) and a low-resistance state (LRS). The switching event from a HRS to a LRS is called a "Set" or "On" switching process. Conversely, the switching from a LRS to a HRS is called a "Reset" or "Off" switching process. Based on the electrical switching conditions, memristors can be classified into two categories including bipolar memristors and unipolar (or nonpolar) memristors. Bipolar memristors are switched by using one voltage polarity for Set switching and the opposite voltage polarity for Reset switching. In contrast, unipolar memristors may be switched by using the same voltage polarity for both the Set and Reset switching. In one example, memristors $206_1$ through $206_N$ are unipolar memristors.

The desired unipolar memristor for a code comparator exhibits symmetrical Set switching with respect to voltage polarity, desired switching threshold voltage, low switching current, high off/on resistance ratio, consistent LRS with small variation, and reasonable endurance. The large off/on resistance ratio increases the signal to noise ratio (SNR) by suppressing the background Off current and enables a larger comparator size for comparison. Memristors may be tuned by device engineering (e.g., via setting of oxide thickness, device size, material composition selection, etc.) to provide the desired performance including the switching voltage threshold and switching current.

To Reset a unipolar memristor from the LRS to the HRS, a voltage is applied across the memristor with no current compliance. The resistance change occurs when the current through the memristor becomes larger than the value of the compliance. To Set the unipolar memristor from the HRS to the LRS, a voltage with current compliance is applied across the memristor. The resistance change occurs when the voltage across the memristor exceeds a threshold voltage of the memristor.

Prior to comparing a wake up signal to a reference signal, each memristor $206_1$ through $206_N$ is Reset to the HRS. A memristor $206_1$ through $206_N$ may be Reset to the HRS by applying an appropriate voltage without current compliance between the corresponding column line $202_1$ through $202_N$ and row line $204_1$ through $204_N$ for the memristor, respectively. With each memristor $206_1$ through $206_N$ in the HRS, a reference signal is applied to column lines $202_1$ through $202_N$ and a wake up signal is applied to row lines $204_1$ through $204_N$. Alternatively, the wake up signal may be applied to column lines $202_1$ through $202_N$ and the reference signal may be applied to row lines $204_1$ through $204_N$.

A digital wake up signal may include multiple bits with each bit passed to a corresponding row line $204_1$ through $204_N$. In this case, a corresponding digital reference signal includes multiple bits with each bit passed to a corresponding column line $202_1$ through $202_N$. In one example, a wake up signal may include a single analog signal, which is passed to a single row line. In this case, a corresponding reference signal is applied to the corresponding column line. In another example, a single wake up signal may be represented by a plurality of analog values with each of the plurality of analog values representing the single wake up signal at a different point in time. In this example, each of the plurality of analog values is passed to a corresponding row line $204_1$ through $204_N$. In this case, a corresponding plurality of analog reference values representing a single analog reference signal at different points in time is applied to column lines $202_1$ through $202_N$.

In response to each value on each row line matching the corresponding reference value on the corresponding column line within a threshold value (i.e., the voltage on each row line equals the voltage on the corresponding column line such that the threshold voltage of each corresponding memristor is not exceeded), the corresponding memristor remains in the HRS. In response to a value on a row line differing from the corresponding reference value on the corresponding column line by the threshold value (i.e., the voltage on a row line does not equal the voltage on the corresponding column line such that the threshold voltage of the corresponding memristor is exceeded), the corresponding memristor switches to the LRS.

The reference values and the values of the wake up signal are then removed from column lines $202_1$ through $202_N$ and row lines $204_1$ through $204_N$, respectively. Memristors $206_1$ through $206_N$ are then read to determine if any of the memristors have been switched to the LRS. Memristor $206_1$ through $206_N$ may be read by grounding one end of each column line $202_1$ through $202_N$ and applying a read voltage to each row line $204_1$ through $204_N$. The current through the other end of each column line $202_1$ through $202_N$ may be summed to provide an indication of how many (if any) of memristors $206_1$ through $206_N$ have been switched to the LRS. If none of the memristors $206_1$ through $206_N$ have been switched to the LRS, the summed current will be a minimum value. Any memristors $206_1$ through $206_N$ that have been switched to the LRS may then be Reset to the HRS and the process may be repeated for the next comparison of a wake up signal to the reference signal.

Figure 2B:
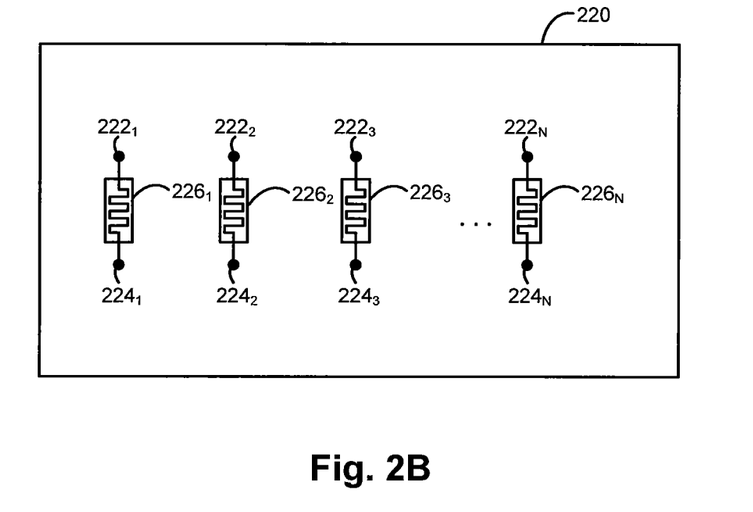
FIG. 2B illustrates another example of a memristor code comparator.

FIG. 2B illustrates another example of a memristor code comparator 220. In one example, memristor code comparator 220 provides memristor code comparator 106 previously described and illustrated with reference to FIG. 1. Memristor code comparator 220 includes a plurality of first nodes $222_1$ through $222_N$, a plurality of second nodes $224_1$ through $224_N$, and a plurality of memristors $226_1$ through $226_N$, where "N" is any suitable number based on the number of bits (for digital signals) or the number of analog values (for analog signals) to be compared. A first terminal of each memristor $226_1$ through $226_N$ is electrically coupled to a first node $222_1$ through $222_N$ and a second terminal of each memristor $226_1$ through $226_N$ is electrically coupled to a second node $224_1$ through $224_N$, respectively. Memristors $226_1$ through $226_N$ are similar to memristors $206_1$ through $206_N$ previously described and illustrated with reference to FIG. 2A.

Prior to comparing a wake up signal to a reference signal, each memristor $226_1$ through $226_N$ is Reset to the HRS. A memristor $226_1$ through $226_N$ may be Reset to the HRS by applying an appropriate voltage without current compliance between the corresponding first node $222_1$ through $222_N$ and second node $224_1$ through $224_N$ for the memristor, respectively. With each memristor $226_1$ through $226_N$ in the HRS, a reference signal is applied to first nodes $222_1$ through $222_N$ and a wake up signal is applied to second nodes $224_1$ through $224_N$. Alternatively, the wake up signal may be applied to first nodes $222_1$ through $222_N$ and the reference signal may be applied to second nodes $224_1$ through $224_N$.

A digital wake up signal may include multiple bits with each bit passed to a corresponding second node $224_1$ through $224_N$. In this case, a corresponding digital reference signal includes multiple bits with each bit passed to a corresponding first node $222_1$ through $222_N$. In one example, a wake up signal may include a single analog signal, which is passed to a single second node. In this case, a corresponding reference signal is applied to the corresponding first node. In another example, a single wake up signal may be represented by a plurality of analog values with each of the plurality of analog values representing the single wake up signal at a different point in time. In this example, each of the plurality of analog values is passed to a corresponding second node $224_1$ through $224_N$. In this case, a corresponding plurality of analog reference values representing a single analog reference signal at different points in time is applied to first nodes $222_1$ through $222_N$.

In response to each value on each first node matching the corresponding reference value on the corresponding second node within a threshold value (i.e., the voltage on each first node equals the voltage on the corresponding second node such that the threshold voltage of each corresponding memristor is not exceeded), the corresponding memristor remains in the HRS. In response to a value on a first node differing from the corresponding reference value on the corresponding second node by the threshold value (i.e., the voltage on a first node does not equal the voltage on the corresponding second node such that the threshold voltage of the corresponding memristor is exceeded), the corresponding memristor switches to the LRS.

The reference values and the values of the wake up signal are then removed from first nodes $222_1$ through $222_N$ and second nodes $224_1$ through $224_N$, respectively. Memristors $226_1$ through $226_N$ are then read to determine if any of the memristors have been switched to the LRS. Memristor $226_1$ through $226_N$ may be read by applying a read voltage to each first node $222_1$ through $222_N$. The current through each second node $224_1$ through $224_N$ may be summed to provide an indication of how many (if any) of memristors $226_1$ through $226_N$ have been switched to the LRS. If none of the memristors $226_1$ through $226_N$ have been switched to the LRS, the summed current will be a minimum value. Any memristors $226_1$ through $226_N$ that have been switched to the LRS may then be Reset to the HRS and the process may be repeated for the next comparison of a wake up signal to the reference signal.

Figure 3:
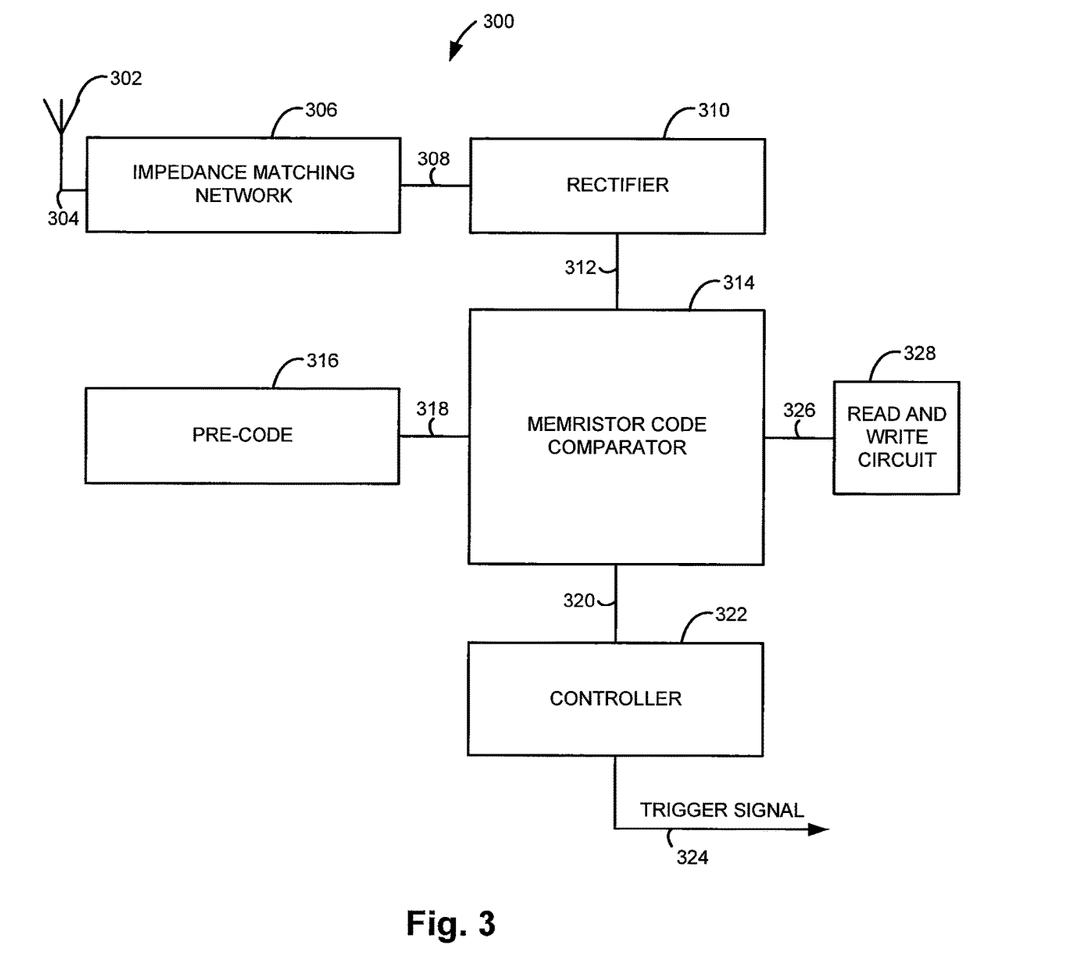
FIG. 3 is a block diagram illustrating one example of a wake up receiver (WURx) of a WSN device including a memristor code comparator to compare a wake up signal to a reference signal.

FIG. 3 is a block diagram illustrating one example of a WURx 300 of a WSN device. WURx 300 includes an antenna 302, an impedance matching network 306, a rectifier 310, a memristor code comparator 314, a pre-code 316, a controller 322, and a read and write circuit 328. Antenna 302 is communicatively coupled to impedance matching network 306 through a communication path 304. Impedance matching network 306 is communicatively coupled to rectifier 310 through a communication path 308. Rectifier 310 is communicatively coupled to memristor code comparator 314 through a communication path 312. Pre-code 316 is communicatively coupled to memristor code comparator 314 through a communication path 318. Memristor code comparator 314 is communicatively coupled to controller 322 through a communication path 320 and to read and write circuit 328 through a communication path 326. Controller 322 provides a trigger signal on a communication path 324.

WURx 300 listens for a wake up signal and provides the trigger signal in response to the wake up signal matching the reference signal of WURx 300. Antenna 302 receives radio signals including a wake up signal. Impedance matching network 306, which is tuned to maximize power transfer from the antenna, passes the wake up signal to rectifier 310. Rectifier 310 converts the wake up signal to a direct current (DC) signal to input to memristor code comparator 314. Pre-code 316 stores the reference signal for WURx 300. The reference signal is based on the WSN communication protocol.

Read and write circuit 328 controls the Reset of the memristors of memristor code comparator 314 and provides a current compliance during the comparison (i.e., during the Set operation). In one example, the current compliance helps to protect memristor code comparator 314 and reduces the variation of memristor code comparator 314. Read and write circuit 328 reads the state of the memristors of memristor code comparator 314 after each comparison.

Memristor code comparator 314 is similar to memristor code comparator 200 previously described and illustrated with reference to FIG. 2A or memristor code comparator 220 previously described and illustrated with reference to FIG. 2B. Memristor code comparator 314 compares the wake up signal received from rectifier 310 to the reference signal received from pre-code 316. The state of the memristors of memristor code comparator 314 are read after each comparison of a wake up signal to the reference signal. In response to reading that at least one memristor has changed states, a "no match" indicator is passed to controller 322. In response to reading that no memristors have changed states, a "match" indicator is passed to controller 322. Each memristor that changed states (e.g., from the HRS to the LRS) during the comparison is then reset back to the initial state (e.g., from the LRS to the HRS) prior to performing the next comparison of a wake up signal to the reference signal.

Controller 322 controls the operation of WURx 300 including the timing of signals passed to memristor code comparator 314 from rectifier 310, pre-code 316, and the reading and writing of memristors within memristor code comparator 314 by read and write circuit 328. Controller 322 may include a processor, a microcontroller, an application-specific integrated circuit (ASIC), a field-programmable gate array (FPGA), or other suitable logic circuitry. Controller 322 provides the trigger signal on communication path 324 to activate the WSN device of which WURx 300 is a part in response to a "match" indicator indicating that the wake up signal matches the reference signal. Controller 322 does not provide the trigger signal on communication path 324 if a "no match" indicator is received indicating that the wake up signal does not match the reference signal. In this case, the WSN device remains inactive until controller 322 receives a "match" indicator.

Figure 4:
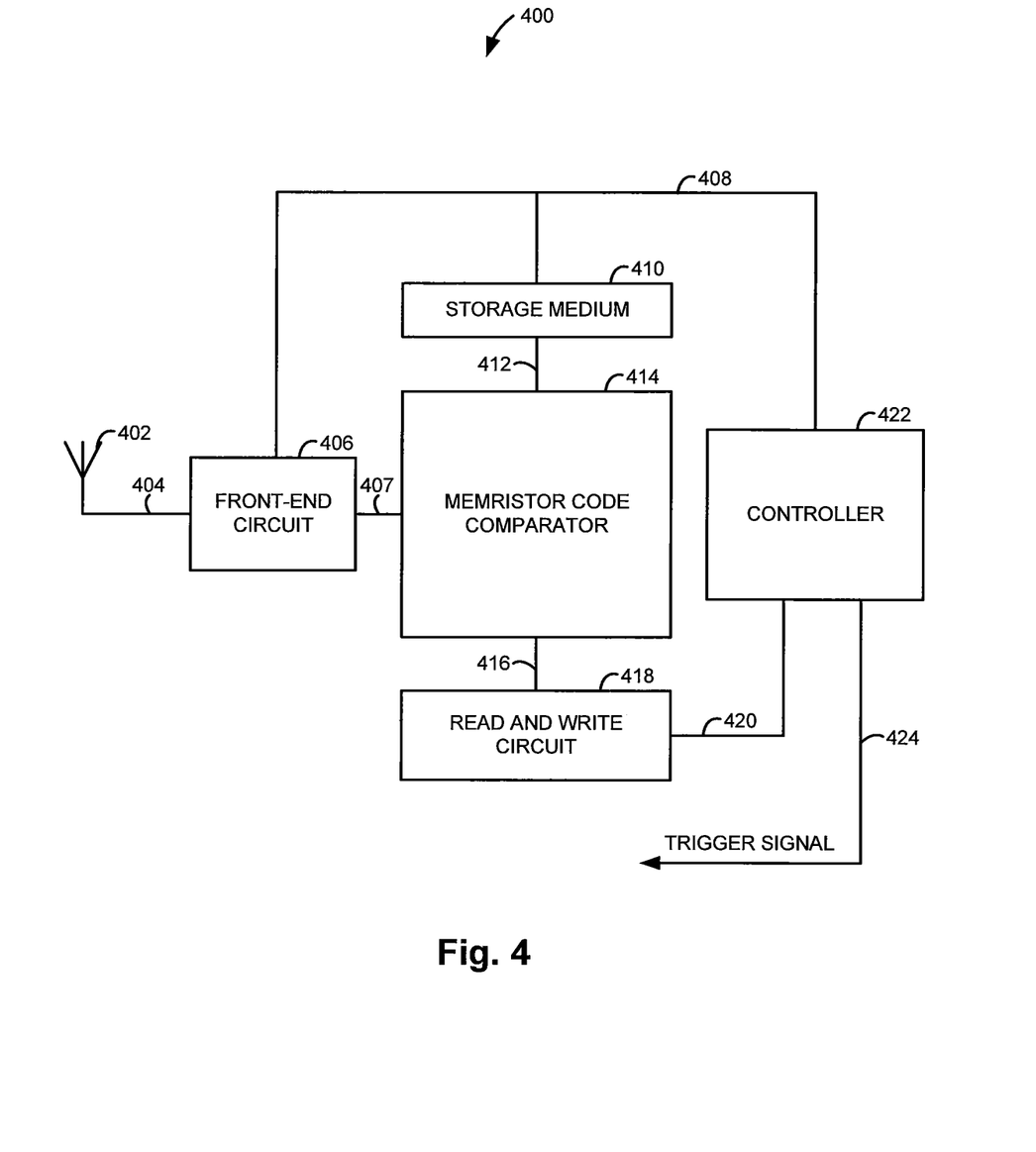
FIG. 4 is a block diagram illustrating another example of WURx of a WSN device including a memristor code comparator to compare a wake up signal to a reference signal.

FIG. 4 is a block diagram illustrating another example of a WURx 400 of a WSN device. WURx 400 includes an antenna 402, a front-end circuit 406, a storage medium 410, a memristor code comparator 414, a read and write circuit 418, and a controller 422. Antenna 402 is communicatively coupled to front-end circuit 406 through a communication path 404. Front-end circuit 406 is communicatively coupled to memristor code comparator 414 through a communication path 407. Storage medium 410 is communicatively coupled to memristor code comparator 414 through a communication path 412. Memristor code comparator 412 is communicatively coupled to read and write circuit 418 through a communication path 416. Read and write circuit 418 is communicatively coupled to controller 422 through a communication path 420. Controller 422 is communicatively coupled to front-end circuit 406 and storage medium 410 through a communication path 408 and provides a trigger signal on a communication path 424.

WURx 400 listens for a wake up signal and provides the trigger signal in response to the wake up signal matching the reference signal of WURx 400. Antenna 402 receives radio signals including a wake up signal and passes the wake up signal to front-end circuit 406. Front-end circuit 406 converts the wake up signal to a multibit signal and provides the multibit signal to memristor code comparator 414 such that each bit of the multibit signal is passed to a corresponding row of memristor code comparator 414.

Storage medium 410 is a machine-readable storage medium. Storage medium 410 may be any suitable electronic, magnetic, optical, or other physical storage device that stores data and/or executable instructions. Thus, storage medium 410 may be, for example, a random access memory (RAM), an electrically-erasable programmable read-only memory (EEPROM), a storage drive, a flash drive, a register, and the like. Storage medium 410 stores a multibit reference signal and passes the multibit reference signal to memristor code comparator 414 such that each bit of the reference signal is passed to a corresponding column of memristor code comparator 414.

Memristor code comparator 414 is similar to memristor code comparator 200 previously described and illustrated with reference to FIG. 2A or memristor code comparator 220 previously described and illustrated with reference to FIG. 2B. Memristor code comparator 414 compares the wake up signal received from front-end circuit 406 to the reference signal received from storage medium 410. Read and write circuit 418 reads the state of the memristors of memristor code comparator 414 after each comparison. In response to reading that at least one memristor has changed states, read and write circuit 418 passes a "no match" indicator to controller 422. In response to reading that no memristors have changed states, read and write circuit 418 passes a "match" indicator to controller 422. Read and write circuit 418 then writes each memristor that changed states (e.g., from the HRS to the LRS) during the comparison back to the initial state (e.g., from the LRS to the HRS) prior to performing the next comparison of a wake up signal to the reference signal.

Controller 422 controls the operation of WURx 400 including the timing of signals passed to memristor code comparator 414 from front-end circuit 406 and storage medium 410 and the reading and writing of memristors within memristor code comparator 414 by read and write circuit 418. Controller 422 may include a processor, a microcontroller, an ASIC, a FPGA, or other suitable logic circuitry. In one example, controller 422 retrieves and executes instructions stored in storage medium 410 to control the operation of WURx 400. Controller 422 provides the trigger signal on communication path 424 to activate the WSN device of which WURx 400 is a part in response to a "match" indicator indicating that the wake up signal matches the reference signal. Controller 422 does not provide the trigger signal on communication path 424 if a "no match" indicator is received indicating that the wake up signal does not match the reference signal. In this case, the WSN device remains inactive until controller 422 receives a "match" indicator.

Figure 5:
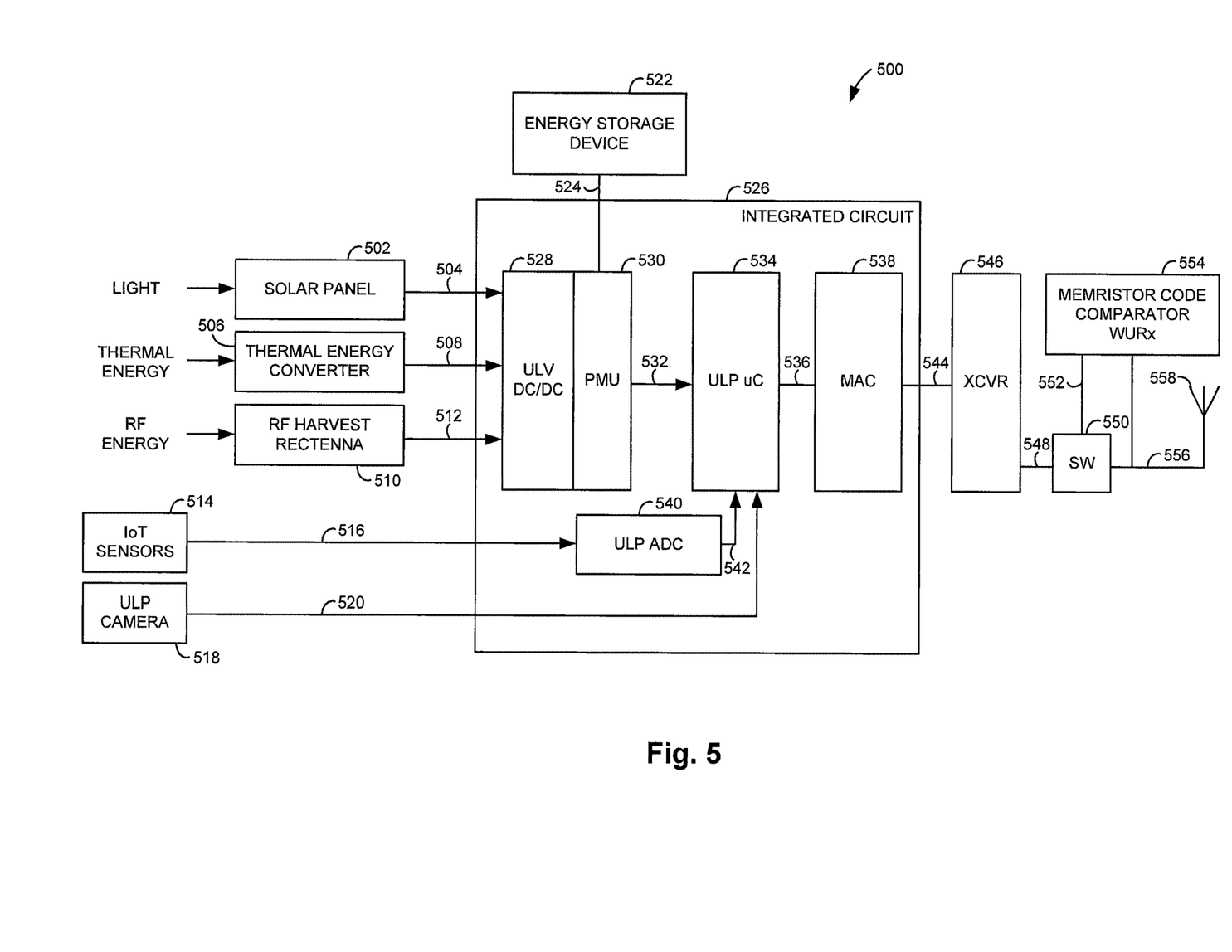
FIG. 5 is a block diagram illustrating one example of a WSN device including a WURx including a memristor code comparator.

FIG. 5 is a block diagram illustrating one example of a WSN device 500. WSN device 500 includes a solar panel 502, a thermal energy converter 506, a radio frequency (RF) harvest rectenna 510, Internet of things (IoT) sensors 514, an ultra-low power (ULP) camera 518, an energy storage device 522, an integrated circuit 526, a transceiver (XCVR) 546, a switch (SW) 550, a memristor code comparator WURx 554, and an antenna 558. Integrated circuit 526 includes an ULP DC/DC converter 528, a power management unit (PMU) 530, an ULP microprocessor (uC) 534, a media access controller (MAC) 538, and an ULP analog-to-digital converter (ADC) 540.

Solar panel 502 is electrically coupled to ULV DC/DC converter 528 through a signal path 504. Thermal energy converter 506 is electrically coupled to ULV DC/DC converter 528 through a signal path 508. RF harvest rectenna 510 is electrically coupled to ULV DC/DC converter 528 through a signal path 512. ULV DC/DC converter 528 is electrically coupled to PMU 530. PMU 530 is electrically coupled to energy storage device 522 through a signal path 524 and to ULP microprocessor 534 through a signal path 532. IoT sensors 514 are communicatively coupled to ULP ADC 540 through a communication path 516. ULP ADC 540 is communicatively coupled to ULP microprocessor 534 through a signal path 542. ULP camera 518 is communicatively coupled to ULP microprocessor 534 through a communication path 520. ULP microprocessor 534 is communicatively coupled to MAC 538 through a communication path 536. MAC 538 is communicatively coupled to transceiver 546 through a communication path 544. Transceiver 546 is communicatively coupled to switch 550 through a communication path 548. Switch 550 is communicatively coupled to memristor code comparator WURx 554 through a communication path 552. Antenna 558 is communicatively coupled to memristor code comparator WURx 554 and switch 550 through a communication path 556.

Memristor code comparator WURx 554 wakes up WSN device 500 in response to detecting a wake up signal matching the reference signal of WSN device 500. In one example, memristor code comparator WURx 554 is provided by WURx 300 previously described and illustrated with reference to FIG. 3 or WURx 400 previously described and illustrated with reference to FIG. 4. In response to a wake up signal matching the reference signal, memristor code comparator WURx 554 provides a trigger signal to switch 550 through communication path 552 to activate transceiver 546. Transceiver 546 then receives and/or transmits information to a user device via antenna 558. In one example, transceiver 546 is a WiFi backscatter transceiver.

In this example, WSN device 500 harvests light energy via solar panel 502, thermal energy via thermal energy converter 506, and RF energy via RF harvest rectenna 510. In other examples, however, at least one of the three energy harvesters 502, 506, and 510 may be excluded and/or WSN device 500 may harvest other suitable forms of energy. The energy harvested by solar panel 502, thermal energy converter 506, and RF harvest rectenna 510 are converted by ULV DC/DC converter 528 to a voltage suitable for operating integrated circuit 526. Power management unit 530 manages the power of WSN device 500 including supplying power to the circuits of WSN device 500 from energy storage device 522 and/or energy harvesters 502, 506, and 510 and charging energy storage device 522 via energy harvesters 502, 506, and 510. Energy storage device 522 may include any suitable energy storage device, such as a battery or a super capacitor.

IoT sensors 514 sense physical or environmental conditions or other suitable values and pass analog sensor signals to ULP ADC 540. ULP ADC 540 converts the analog sensor signals to digital sensor signals, which are passed to ULP microprocessor 534. ULP camera 518 transmits digital video feeds to ULP microprocessor 534. ULP microprocessor 534 controls the operation of WSN device 500 including the processing of instructions and data. MAC 538 provides the network communication interface between ULP microprocessor 534 and transceiver 546, which communicates with a user device via antenna 558 when WSN device 500 is active. Accordingly, WSN device 500 with memristor code comparator WURx 554 is a self-contained sensor node powered by harvested energy.

Figure 6:
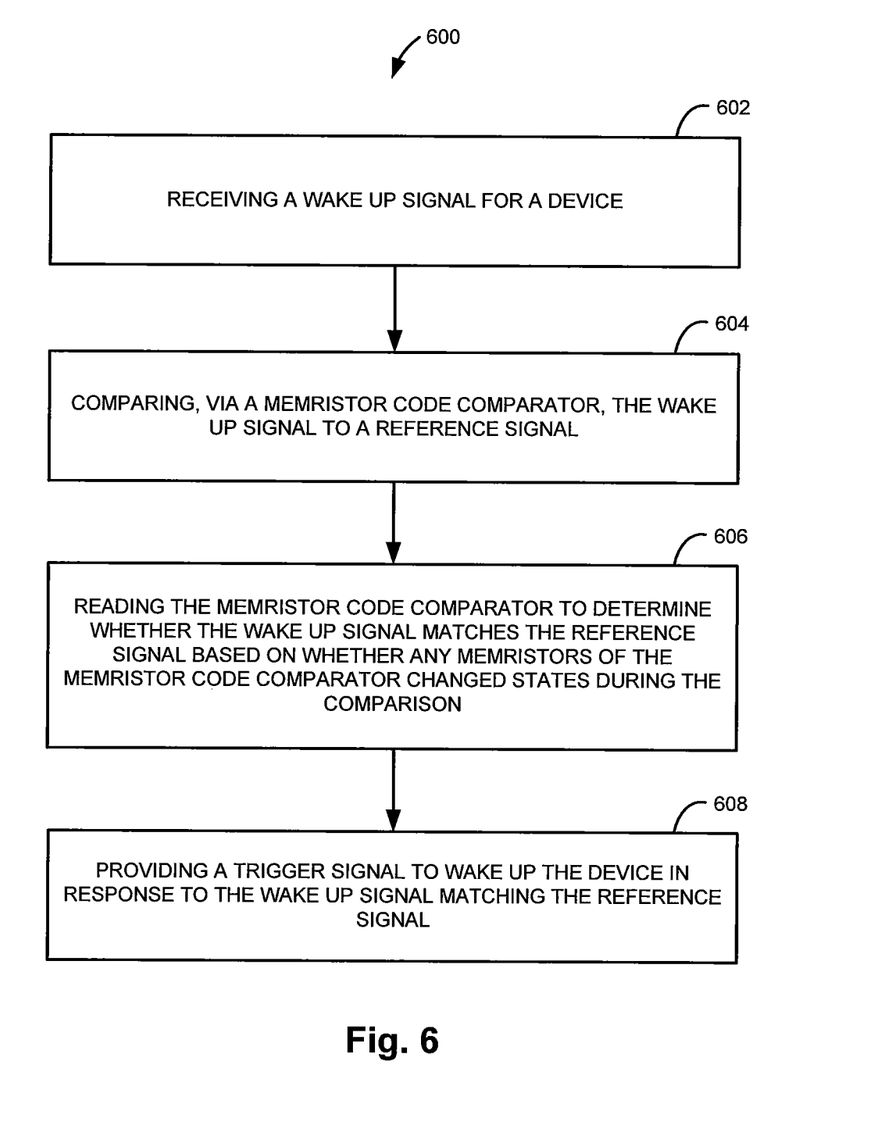
FIG. 6 is a flow diagram illustrating one example of a method for comparing a wake up signal to a reference signal using a memristor code comparator.

FIG. 6 is a flow diagram illustrating one example of a method 600 for comparing a wake up signal to a reference signal using a memristor code comparator. At 602, method 600 includes receiving a wake up signal for a device. In one example, the device includes a WSN device. At 604, method 600 includes comparing, via a memristor code comparator, the wake up signal to a reference signal. At 606, method 600 includes reading the memristor code comparator to determine whether the wake up signal matches the reference signal based on whether any memristors of the memristor code comparator changed states during the comparison. At 608, method 600 includes providing a trigger signal to wake up the device in response to the wake up signal matching the reference signal.

In one example, comparing, via the memristor code comparator, the wake up signal to the reference signal includes changing the state of a corresponding memristor of the memristor code comparator in response to a voltage difference between a corresponding bit of the wake up signal and a corresponding bit of the reference signal exceeding a threshold value of the corresponding memristor. Method 600 may also include resetting memristors of the memristor code comparator to an initial state in response to memristors of the memristor code comparator changing states during the comparison. Method 600 may further include fully powering a transceiver of the device in response to the trigger signal.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A device comprising:
an antenna to receive a wake up signal; and
a memristor code comparator to compare the wake up signal to a reference signal;
a read and write circuit to read the state of the memristors of the memristor code comparator after each comparison and to write each memristor that changed states during the comparison back to an initial state; and
a controller to provide a trigger signal to wake up the device in response to the wake up signal matching the reference signal.

2. The device of claim 1, wherein the memristor code comparator comprises a memristor array comprising a plurality of row lines, a plurality of column lines, and a plurality of memristors, wherein each of the memristors is coupled between a unique combination of a row line and a column line.

3. The device of claim 1, wherein the memristor code comparator comprises a memristor array comprising a plurality of first nodes, a plurality of second nodes, and a plurality of memristors, wherein each of the memristors is coupled between a unique combination of a first node and a second node.

4. The device of claim 1, further comprising:
a rectifier to convert the wake up signal to a direct current (DC) signal to input to the memristor code comparator.

5. The device of claim 1, wherein the device comprises a wireless sensor network device.

6. The device of claim 1, further comprising:
a front-end circuit to receive the wake up signal from the antenna and provide a multibit signal representative of the wake up signal to the memristor code comparator.

7. The device of claim 6, wherein the wake up signal comprises a multibit digital signal, and
wherein the reference signal comprises a multibit digital reference signal.

8. The device of claim 1, wherein the memristor code comparator comprises a memristor array comprising a plurality of row lines, a plurality of column lines, and a plurality of memristors, wherein each of the memristors is coupled between a unique combination of a row line and a column line,
wherein each bit of the wake up signal is applied to a corresponding row line, and
wherein each bit of the reference signal is applied to a corresponding column line.

9. The device of claim 1, further comprising:
an energy harvester to harvest energy; and
an energy storage device to store the harvested energy and to power the device.

10. A device comprising:
an antenna to receive a wake up signal;
a storage medium storing a reference signal;
a memristor code comparator to compare the wake up signal to the reference signal;
a read and write circuit to read the state of the memristors of the memristor code comparator after each comparison and to write each memristor that changed states during the comparison back to an initial state; and
a controller to provide a trigger signal to wake up the device in response to the wake up signal matching the reference signal.

11. The device of claim 10, further comprising:
a front-end circuit to receive the wake up signal from the antenna and provide a multibit signal representative of the wake up signal to the memristor code comparator.

12. The device of claim 10, wherein the wake up signal comprises a multibit digital signal, and
wherein the memristor code comparator receives a multibit digital reference signal from the storage medium.

13. The device of claim 10, wherein the memristor code comparator comprises a memristor array comprising a plurality of row lines, a plurality of column lines, and a plurality of memristors, wherein each of the memristors is coupled between a unique combination of a row line and a column line,
wherein each bit of the wake up signal is applied to a corresponding row line, and wherein each bit of the reference signal is applied to a corresponding column line.

14. The device of claim 10, further comprising:
an energy harvester to harvest energy; and
an energy storage device to store the harvested energy and to power the device.

15. A method comprising:
receiving a wake up signal for a device;
comparing, via a memristor code comparator, the wake up signal to a reference signal;
reading the memristor code comparator to determine whether the wake up signal matches the reference signal based on whether any memristors of the memristor code comparator changed states during the comparison; and
providing a trigger signal to wake up the device in response to the wake up signal matching the reference signal,
wherein comparing, via the memristor code comparator, the wake up signal to the reference signal comprises changing the state of a corresponding memristor of the memristor code comparator in response to a voltage difference between a corresponding bit of the wake up signal and a corresponding bit of the reference signal exceeding a threshold value of the corresponding memristor.

16. The method of claim 15, further comprising:
fully powering a transceiver of the device in response to the trigger signal.

17. The method of claim 15, wherein the device comprises a wireless sensor network device.

18. A method comprising:
receiving a wake up signal for a device;
comparing, via a memristor code comparator, the wake up signal to a reference signal;
reading the memristor code comparator to determine whether the wake up signal matches the reference signal based on whether any memristors of the memristor code comparator changed states during the comparison;
providing a trigger signal to wake up the device in response to the wake up signal matching the reference signal; and
resetting memristors of the memristor code comparator to an initial state in response to memristors of the memristor code comparator changing states during the comparison.

19. The method of claim 18, further comprising:
fully powering a transceiver of the device in response to the trigger signal.

20. The method of claim 18, wherein the device comprises a wireless sensor network device.

* * * * *